United States Patent
Gruber et al.

(10) Patent No.: US 10,715,185 B1
(45) Date of Patent: Jul. 14, 2020

(54) DIGITAL-TO-ANALOG CONVERSION SYSTEM

(71) Applicant: Intel Corporation, Santa Clara, CA (US)

(72) Inventors: Daniel Gruber, St. Andrae (AT); Ramon Sanchez, Galapagar (ES); Kameran Azadet, San Ramon, CA (US); Martin Clara, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/369,317

(22) Filed: Mar. 29, 2019

(51) Int. Cl.
*H04B 1/00* (2006.01)
*H04B 1/04* (2006.01)
*H03M 1/66* (2006.01)
*H04B 1/10* (2006.01)

(52) U.S. Cl.
CPC ............ *H04B 1/0017* (2013.01); *H03M 1/66* (2013.01); *H04B 1/0475* (2013.01); *H04B 1/1027* (2013.01); *H04B 2001/0408* (2013.01)

(58) Field of Classification Search
CPC .. H04B 1/0017; H04B 1/0475; H04B 1/1027; H03M 1/66
See application file for complete search history.

(56) References Cited

U.S. PATENT DOCUMENTS

| 2011/0135034 A1* | 6/2011 | Mujica | H03F 1/3247 375/296 |
| 2016/0079933 A1* | 3/2016 | Fehri | H03F 1/3247 |
| 2016/0365965 A1* | 12/2016 | Kuroda | H04L 5/1461 |

OTHER PUBLICATIONS

Y. Liu, J. J. Yan, H. Dabag and P. M. Asbeck, "Novel Technique for Wideband Digital Predistortion of Power Amplifiers With an Under-Sampling ADC," in IEEE Transactions on Microwave Theory and Techniques, vol. 62, No. 11, pp. 2604-2617, Nov. 2014 (Year: 2014).*

* cited by examiner

*Primary Examiner* — Jaison Joseph
(74) *Attorney, Agent, or Firm* — 2SPL Patent Attorneys

(57) ABSTRACT

A digital-to-analog conversion system is provided. The digital-to-analog conversion system includes a digital-to-analog converter configured to receive a pre-distorted digital signal from a digital circuit, and to generate an analog signal based on the pre-distorted digital signal. Further, the digital-to-analog conversion system includes a feedback loop for providing a digital feedback signal to the digital circuit. The feedback loop includes an analog-to-digital converter configured to generate the digital feedback signal based on the analog signal, and wherein a sample rate of the analog-to-digital converter is lower than a sample rate of the digital-to-analog converter.

21 Claims, 6 Drawing Sheets

DIGITAL-TO-ANALOG CONVERSION SYSTEM

FIELD

The present disclosure relates to digital-to-analog conversion. In particular, examples relate to digital-to-analog conversion systems, a transmitter, a base station and a mobile device.

BACKGROUND

Digital PreDistortion (DPD) is a digital technique mainly known for improving the linearity of power amplifiers. Power amplifiers operate with better or more energy efficiency when a certain degree of nonlinearity is allowed—typically compression of the input signal (i.e. a smaller gain at higher amplitudes is allowed). The nonlinear input-output relationship changes the harmonic content of the signal. This causes, e.g., harmonic distortions (i.e. overtones that are multiples of the input signal frequencies) or inter-modulation distortions (i.e. additional signal components at frequencies that are the sum and difference of the frequencies of the original input signal components and at frequencies that are multiples of those sum and difference frequencies). These distortions may introduce interference in both adjacent and distant signal channels. With each new communication standard, the requirements regarding the maximum allowed interference in other radio channels are getting stricter.

Similarly, digital to analog converters (DAC) are also affected by nonlinearity (although the nonlinearity may be reduced as described above)—for example if the digital to analog converters are designed for low power consumption. In addition to the inherent nonlinearity of the digital to analog converter itself (e.g. due to the use of nonlinear elements such as transistors, see above), there are other effects that translate into nonlinear behavior. For example, a non-ideal power supply, an associated network, component mismatches or clock distribution skew.

DPD may be used to mitigate the digital to analog converter nonlinearity. For proper mitigation of the digital to analog converter nonlinearity, a trained DPD (e.g. a DPD algorithm) is needed.

Hence, there may be a desire for improved DPD training architectures.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
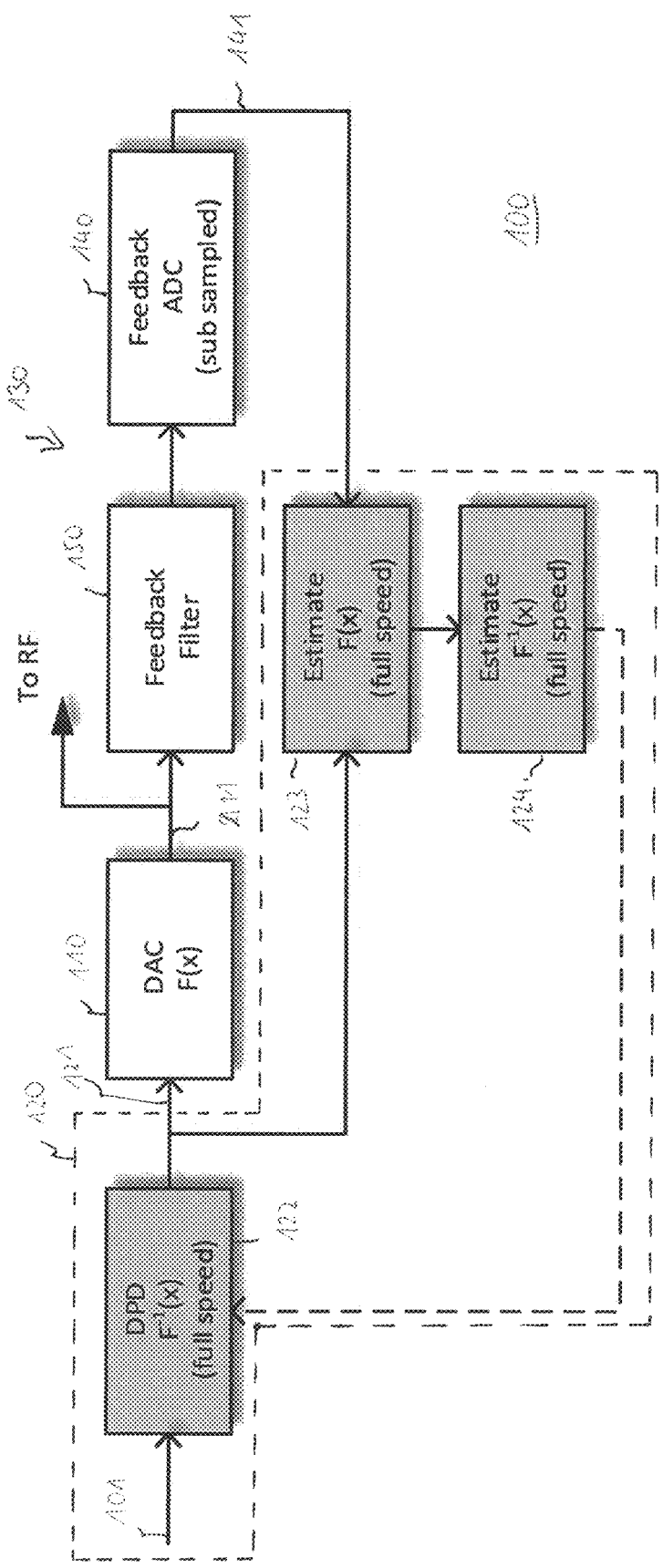
FIG. 1 illustrates a first example of an exemplary digital-to-analog conversion system.

FIG. 1 illustrates an exemplary digital-to-analog conversion system 100 that may enable DPD training with reduced complexity, (die) size and cost. The digital-to-analog conversion system 100 comprises a digital to analog converter 110 configured to receive a pre-distorted digital signal 121 from a digital circuit 120 (e.g. a Digital Signal Processor, DSP). The digital to analog converter 110 is further configured to generate an analog signal 111 based on the pre-distorted digital signal 121. For example, the analog signal 111 may be a Radio Frequency (RF) signal for transmission to the environment.

The digital-to-analog conversion system 100 further comprises a feedback loop 130 for providing a digital feedback signal 141 to the digital circuit 120 that enables the digital circuit 120 to train the DPD (algorithm). The feedback loop 130 comprises an Analog-to-Digital Converter (ADC) 140 configured to generate the digital feedback signal 141 based on the analog signal 111 output by the digital to analog converter 110. A sample rate of the ADC 140 is lower than a sample rate of the digital to analog converter 110. The sample rate of the digital to analog converter 110 denotes the rate at which the digital to analog converter 110 updates its analog output signal (such as the analog signal 111) based on digital input data (such as the pre-distorted digital signal 121). In other words, the sample rate of the digital to analog converter 110 denotes the rate at which the digital to analog converter 110 acquires digital input samples for updating its analog output signal. The sample rate of the ADC 140 denotes the rate at which the ADC 140 acquires (samples) an analog input signal (such as the analog signal 111). For example, the sample rate of the ADC 140 may be at least 5, 10, 20, 50, 100 or 200 times lower than the sample rate of the digital to analog converter 110. In other words, the feedback loop 130 uses a sub-sampled ADC for generating the digital feedback signal 141 for the digital circuit 120. For example, the ADC 140 may be a Successive Approximation Register (SAR) ADC, a flash ADC (also referred to as direct conversion ADC), a pipeline ADC, a sigma-delta ADC or a time-interleaved ADC.

Sampling the analog signal 111 of the digital to analog converter 110 at a (significantly) lower rate may allow to generate a digital feedback that enables the digital circuit 120 to train the DPD. Compared to conventional approaches, no high-speed/full-speed ADC running at the sample rate of the digital to analog converter 110 is required. The sub-sampled ADC 140 may exhibit reduced complexity, (die) size, costs and power consumption compared to a high-speed/full-speed ADC running at the sample rate of the digital to analog converter 110.

As said above, the digital circuit 120 may train the DPD using the sub-sampled digital feedback signal 141 exhibiting a lower sample rate the pre-distorted digital signal 121. For example, the digital circuit 120 may be configured to determine, based on the pre-distorted digital signal 121 and the digital feedback signal 141, a mathematical model of a transfer function of the digital to analog converter 110 when operating at a maximum value of the sample rate (indicated in FIG. 1 by means of functional estimation block 123). Further, the digital circuit 120 may be configured to determine, based on the mathematical model of the transfer function of the digital to analog converter 110, a set of pre-distortion coefficients (indicated in FIG. 1 by means of functional estimation block 124). The digital circuit 120 may use the set of pre-distortion coefficients for generating the pre-distorted digital signal 121 based on a digital signal 101 (indicated in FIG. 1 by means of functional DPD block 121).

The theoretical background how a set of pre-distortion coefficients for generating the pre-distorted digital signal 121 may be determined based on the sub-sampled digital feedback signal 141 will be described in the following. It is to be noted that the following mathematical description is for illustrative purposes only and does not limit the proposed architecture.

If $x(n)$ is the input of the digital to analog converter 110 and $z(n)$ its output, a (e.g. nonlinear) distortion of the digital to analog converter output may be expressed as $z(n)=F(x(n))$. A function that corrects the nonlinearity and is applied to $z(n)$, i.e. at the output of the digital to analog converter 110, may be referred to as "post-distortion function". The post-distortion function would be such that $x(n)=F^{-1}(z(n))$, or equivalently $x(n)=F^{-1}(F(x(n)))$.

Pre-distortion is based in the fact that (under certain conditions) the post-distortion function $F^{-1}$ is valid if it is applied to the input of the digital to analog converter 110, i.e. that $(n)=F(F^{-1}(x(n)))$.

Therefore, a function $F^{-1}$ may be found such that $x(n)=F^{-1}(z(n))$. This function may be used as a pre-distorter to generate a signal $y(n)=F^{-1}(x(n))$ such that $F(y(n))=x(n)$.

In practice, only an approximation of $F^{-1}$ may be found, usually by minimization of the Mean Square Error (MSE) of an error function $e(n)=x(n)-F^{-1}(z(n))$.

The nonlinear mathematical models more often used to describe the behaviour of both $F$ and $F^{-1}$ are of the class known as "Linear in Parameters", of the form $$z(n)=\Sigma_{k=0}^{K-1} a_k g_k(x(n-l), \ldots, x(n+m)) \quad (1)$$

$a_k$ denotes constant parameters and $g(x(n-l), \ldots, x(n+m))$ denotes a nonlinear function of the model input samples. The models of this type have the advantage of being easy to optimize by MSE techniques and are therefore very commonly used.

Mathematical expression (1) may be expressed in matrix form:

$$z=G(x)a \quad (2)$$

Using the following abbreviations:

$$z=z(1)z(2)\ldots z(N))^T \quad (3)$$

$$a=(a_0 a_1 \ldots a_K)^T \quad (4)$$

and $$G(x) = \quad (5)$$

$$\begin{pmatrix} g_0(x(1-l), \ldots, x(1+m)) & \ldots & g_{K-1}(x(1-l), \ldots, x(1+m)) \\ \ldots & \ldots & \ldots \\ g_0(x(N-l), \ldots, x(N+m)) & \ldots & g_{K-1}(x(N-l), \ldots, x(N+m)) \end{pmatrix}$$

The MSE solution is given by $$a=(G(x)^T G(x))^{-1} G(x)^T z \quad (6)$$

This type of model may be used for both $z(n)=F(x(n))$ and $x(n)=F^{-1}(z(n))$. The fundamental reason that allows for the subsampled ADC 140 is that mathematical expression (6) is also valid if the output samples of the system that is being modelled are not selected consecutive, i.e.

$$z=(z(i_1)z(i_2)\ldots z(i_N)) \quad (7)$$

wherein the values $i_n$ are not consecutive (sub sampled) in mathematical expression (7), and $$G(x) = \quad (8)$$

$$\begin{pmatrix} g_0(x(i_1-l), \ldots, x(i_1+m)) & \ldots & g_{K-1}(x(i_1-l), \ldots, x(i_1+m)) \\ \ldots & \ldots & \ldots \\ g_0(x(i_N-l), \ldots, x(i_N+m)) & \ldots & g_{K-1}(x(i_N-l), \ldots, x(I_N+m)) \end{pmatrix}$$

It may be concluded from mathematical expressions (7) and (8) that the observed set of samples at the output of the nonlinearity $z$ does not require to be a set of consecutive samples. In contrast the input $x$ demands to be a set of consecutive samples, since the values in $x(n-l), \ldots, x(n+m)$ are a set of consecutive samples.

As a consequence, the direct model of the ADC 110, where the input is the known digital to analog converter input $x(n)$ and the output is the ADC output, can be calculated with an arbitrarily set of samples $z(i_1) z(i_2) \ldots z(i_N)$.

If the same MSE method was used to directly estimate the inverse nonlinearity $x(n)=F^{-1}(z(n))$, the MSE solution would be given by $$a=(G(z)^T G(z))^{-1} G(z)^T x \quad (9)$$

Mathematical expression (9) would require a consecutive sets of samples of the form z(n−l), . . . , z(n+m) only available if the ADC is running at full sample rate.

For example, the digital circuit 120 may first estimate (determine) the (e.g. nonlinear digital to analog converter) model z(n)=F(x(n)) based on the sub-sampled set of digital to analog converter outputs (captured using the sub-sampled ADC 140). Once the direct model of the digital to analog converter 110 is available, the digital circuit 120 may estimate (determine) a full set of consecutive digital to analog converter output samples based on the complete set of successive digital to analog converter input samples. The digital circuit 120 then may estimate (determine) a G (z) matrix and calculate the inverse of the digital to analog converter nonlinearity, i.e. the DPD function, based on the full set of digital to analog converter outputs.

In the example of FIG. 1, the feedback loop 130 further comprises a filter 150 that is coupled between the digital to analog converter 110 and the ADC 140. The filter 150 exhibits a fix (unchangeable, non-tunable) cutoff frequency. In other words, the cutoff frequency is independent from an instantaneous value of the sample rate of the digital to analog converter 110.

The filter 150 may, e.g., be used for anti-alias-filtering the analog signal 111 before the ADC 140 samples the analog signal 111. For example, the cutoff frequency of the filter 150 may be equal to half of a maximum value of the sample rate of the digital to analog converter 110 so that signal energy at frequencies above half of the maximum value of the sample rate is removed from the analog signal 111. In order to be capable of processing the filtered analog signal 111 simultaneously along its entire bandwidth, an input bandwidth of the filter 150 may be equal to or higher than half of a maximum value of the sample rate of the digital to analog converter 110. Similarly, an input bandwidth of the ADC 140 may be equal to or higher than half of a maximum value of the sample rate of the digital to analog converter 110.

In order to ensure that the above mentioned selection of samples $z(i_1) z(i_2) \ldots z(i_N)$ taken by the ADC 140 covers the full range of digital to analog converter output amplitudes so that it is representative of the behaviour of the digital to analog converter 110 at different amplitudes, the set of sampling points $i_1, i_2, i_N$ may be irregularly spaced. This will become more evident from the following description of FIG. 2.

Figure 2:
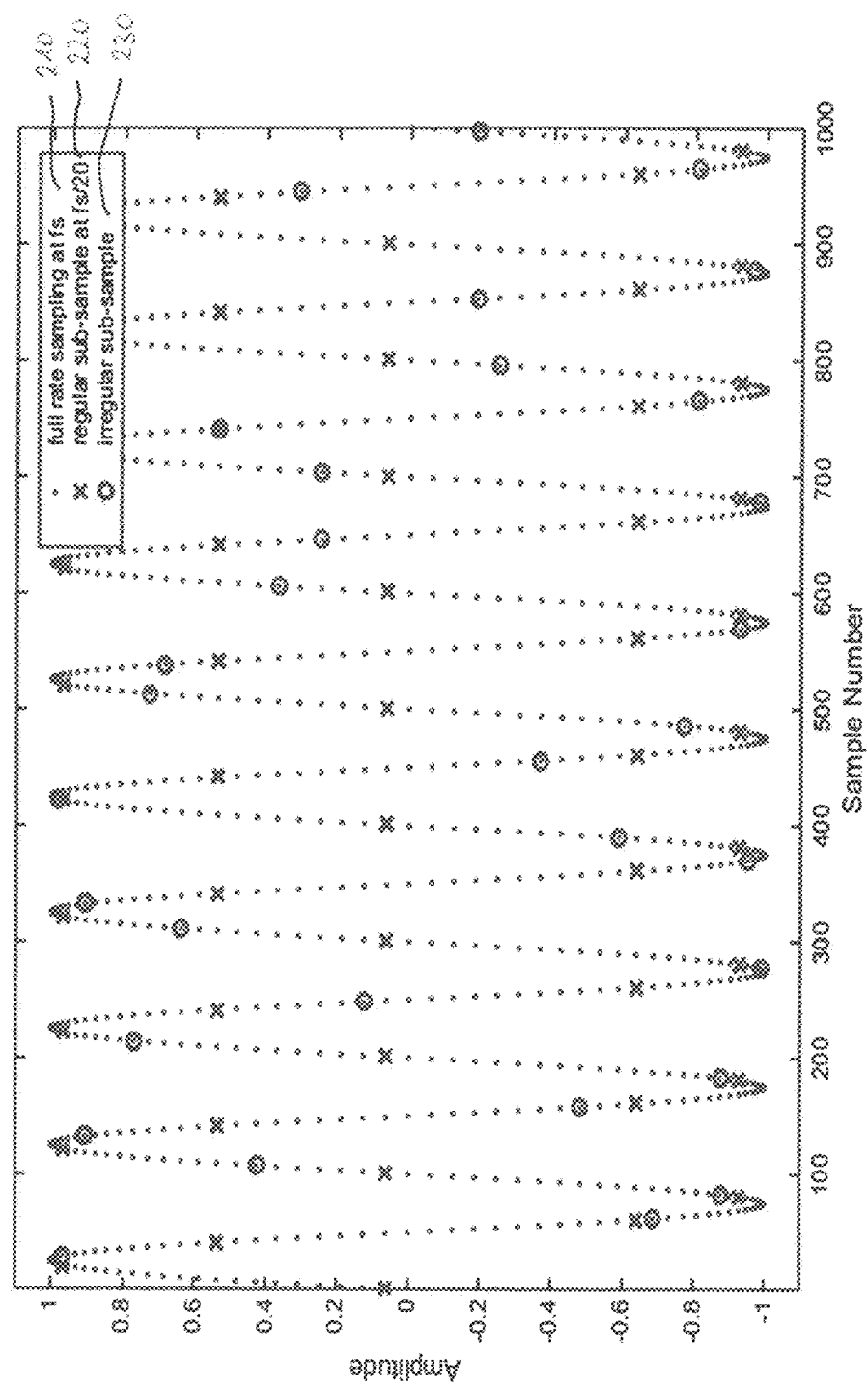
FIG. 2 illustrates an example of a signal sampled with different sample settings.

In FIG. 2, it is assumed that the digital to analog converter 110 outputs a sinusoidal analog signal. As a reference, samples 210 taken by an ADC at a sample rate that is equal to the maximum value of the sample rate of the digital to analog converter 110 are illustrated. The samples 210 replicate well the sinusoidal shape of the analog signal.

Further, samples 220 and 230 are illustrated. The samples 220 and 230 are taken by ADC 140 for two different sample settings. The samples 220 are taken by the ADC 140 at a sample rate that is 1/20 of the maximum value of the sample rate of the digital to analog converter 110. The samples 220 are taken at regular (constant, unchanged) time intervals. As can be seen from FIG. 2, the sinusoidal analog signal is always sampled at one of only five different amplitudes. Therefore, the samples 220 do not cover the full range of digital to analog converter output amplitudes. In other words, the samples 220 are de facto not representative of the behaviour of the digital to analog converter 110 at different amplitudes.

On the other hand, the 230 are taken at irregular (altered, changed) time intervals. It can be seen from FIG. 2, that the sinusoidal analog signal is sampled at many different amplitudes. Therefore, the samples 230 substantially cover the full range of digital to analog converter output amplitudes so that the samples 230 are representative of the behaviour of the digital to analog converter 110 at different amplitudes.

In the example of FIG. 1, the ADC 100 may, hence, be configured to sample the analog signal 111 at irregular (varying) time intervals such that the sample rate of the ADC 140 is (remains) constant on average. The ADC 140 may be controlled in many ways such that it samples the analog signal 111 at irregular time intervals. In the following, two exemplary implementations are described. However, the ADC 140 is not limited to those implementations.

For example, the ADC 140 may be configured to receive a clock signal and count a number of clock cycles of the clock signal. Further, the ADC 140 may be configured to sample the analog signal every time the number of clock cycles is equal to a stored value. After sampling the analog output signal, the ADC 140 may be configured update the stored value. By updating the stored value, the number of clock cycles between two sampling events may be effectively varied. For example, the number of clock cycles may be varied between 48 and 64 by incrementing the stored value after sampling the analog output signal, or by setting the stored value to a new random value between 48 and 64 after sampling the analog output signal.

In other examples, the digital-to-analog conversion system 100 may, e.g., further comprise a clock divider circuit (not illustrated) configured to receive a first clock signal and to divide the first clock signal with varying division factors in order to generate a second clock signal with varying clock cycles for the ADC 140. The ADC 140 may be configured to sample the analog signal 111 based on the second clock signal so that it samples the analog signal 111 at irregular time intervals.

In the example of FIG. 2, the sinusoidal analog signal exhibits a constant signal shape, i.e. the shape of the sinusoidal analog signal does not change with time. For analog signals exhibiting a substantially constant signal shape, irregular sampling may be used to acquire samples that are representative of the behaviour of the digital to analog converter 110 at different amplitudes.

If the analog signal sampled by the digital to analog converter 140 varies enough, regular sampling may be sufficient. For example, if the analog signal is not sinusoidal but with varying phase or if the frequency of the analog signal is not a multiple of the sampling rate, regular sampling may be sufficient. In other words, the ADC 140 may, in some alternative examples, be configured to sample the analog output signal 211 at regular (constant) time intervals.

For example, the ADC 140 may be capable of sampling the analog output signal at regular time intervals and at irregular time intervals. If a control signal received by the ADC 140 indicates that the analog output signal 111 exhibits a predetermined signal condition, the ADC 140 may be configured to sample the analog output signal 111 at regular time intervals. On the other hand, if the control signal indicates that the analog output signal 111 exhibits another predetermined signal condition, the ADC 140 may be configured to sample the analog output signal 111 at irregular time intervals.

Information about the signal conditions of the analog output signal 111 may, e.g., be available at the digital circuit 120. Accordingly, the control signal for adjusting the sample behavior of the ADC 140 may, e.g., be supplied to the ADC 140 by the digital circuit 120 (or a baseband circuit coupled to the digital-to-analog conversion system 100).

Figure 3:
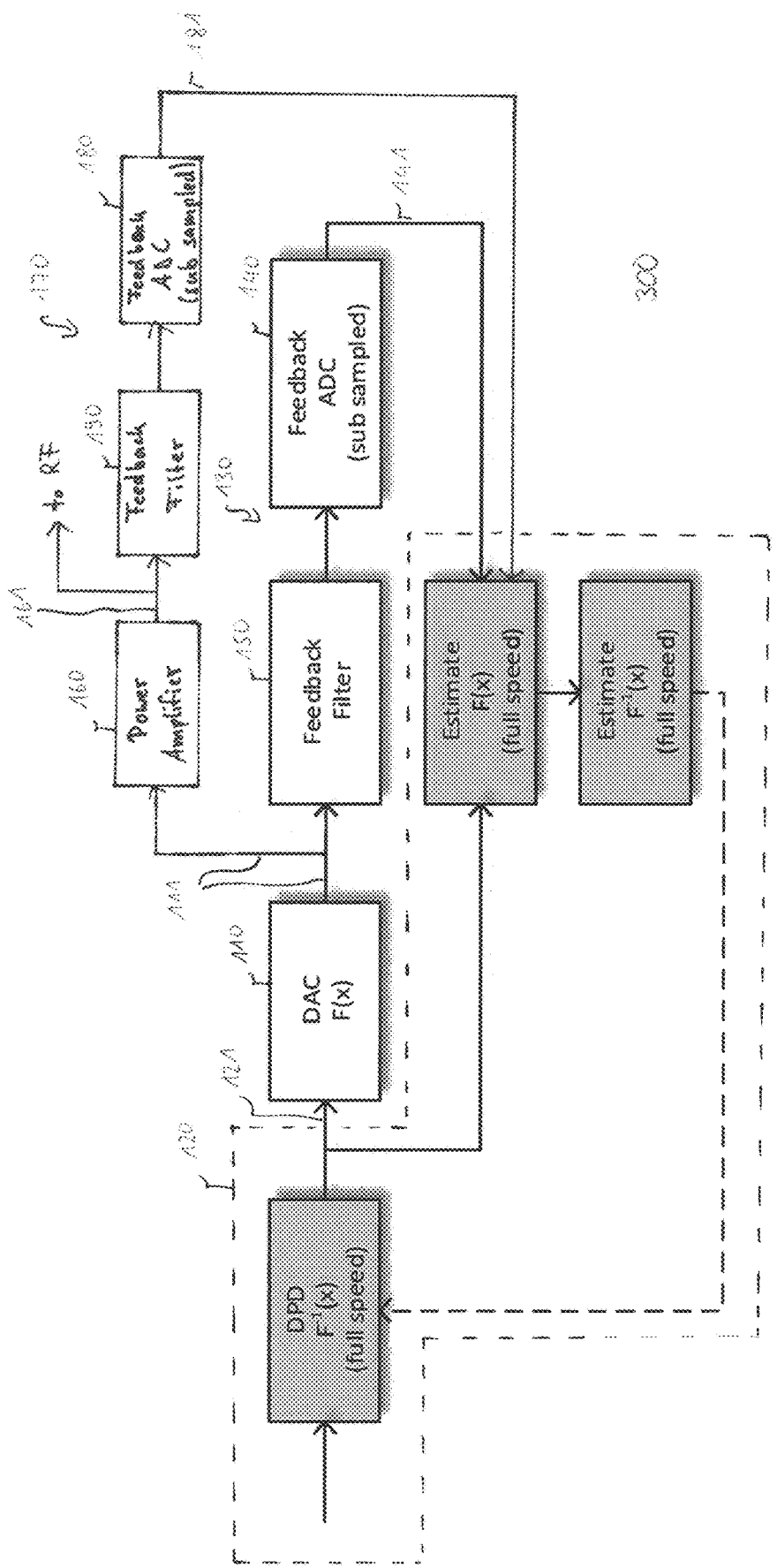
FIG. 3 illustrates a second example of a digital-to-analog conversion system.

In some examples, the digital-to-analog conversion system may further comprise a power amplifier for amplifying the digital to analog converter output. An exemplary digital-to-analog conversion system 300 is illustrated in FIG. 3. Digital-to-analog conversion system 300 is substantially similar to the digital-to-analog conversion system 100 described above. Therefore, it is mainly referred to the differences between both digital-to-analog conversion systems.

In comparison to the digital-to-analog conversion system 100, the digital-to-analog conversion system 300 additionally comprises a Power Amplifier 160 coupled to the digital to analog converter 110 and configured to amplify the analog signal 111 for generating an amplified signal 161 (e.g. an amplified RF transmit signal).

As described above, DPD may be used to compensating the nonlinearity of power amplifiers. In order to additionally train the DPD for the nonlinearities of the power amplifier 160, the digital-to-analog conversion system 300 comprises a second feedback loop 170 in addition to feedback loop 130.

The second feedback loop 170 is for providing a second digital feedback signal 181 to the digital circuit 120. The second feedback loop 170 comprises a second ADC 180 configured to generate the second digital feedback signal 181 based on the amplified signal 161 output by the power amplifier 160. A sample rate of the second ADC 180 is lower than a sample rate of the digital to analog converter 110. For example, the ADCs 140 and 180 may operate at the same sample rate. Further, the second feedback loop 170 comprises a second filter 190 with the fix cutoff frequency. The second filter 190 is coupled between the power amplifier 160 and the second ADC 180. In other words, also the output of the power amplifier 160 is sub sampled in order to provide a feedback for DPD training. The second feedback loop 170 may be implemented substantially similar to the feedback loop 130. For example, individual components of the second feedback loop 170 (e.g. the filter 190) may be configured in an equivalent manner as their counterparts in the feedback loop 130 (e.g. the filter 150).

Similar to what is described above, the digital circuit 120 may be configured to determine, based on the pre-distorted digital signal 121 and the second digital feedback signal 181, a mathematical model of a transfer function of the power amplifier 160. The digital circuit 120 may, similar to the above explanations, be configured to determine the set of pre-distortion coefficients for generating the pre-distorted digital signal 121 further based on the mathematical model of the transfer function of the power amplifier 160.

Accordingly, a low cost, low (die) area and low power feedback path circuitry for a combined system of a digital to analog converter and a power amplifier may be provided that enables to train a DPD function for compensating (mitigating) the nonlinear behavior of the digital to analog converter and the power amplifier.

In the examples described above in connection with FIGS. 1 to 3, it was assumed that the sample rate of the pre-distorted digital signal 121 is equal to the maximum value of the sample rate of the digital to analog converter 110, i.e. that the digital to analog converter 110 is operating at its maximum sample rate. However, the proposed architecture may be used for any sample rate of the digital to analog converter. An according exemplary digital-to-analog conversion system 400 is illustrated in FIG. 4.

Figure 4:
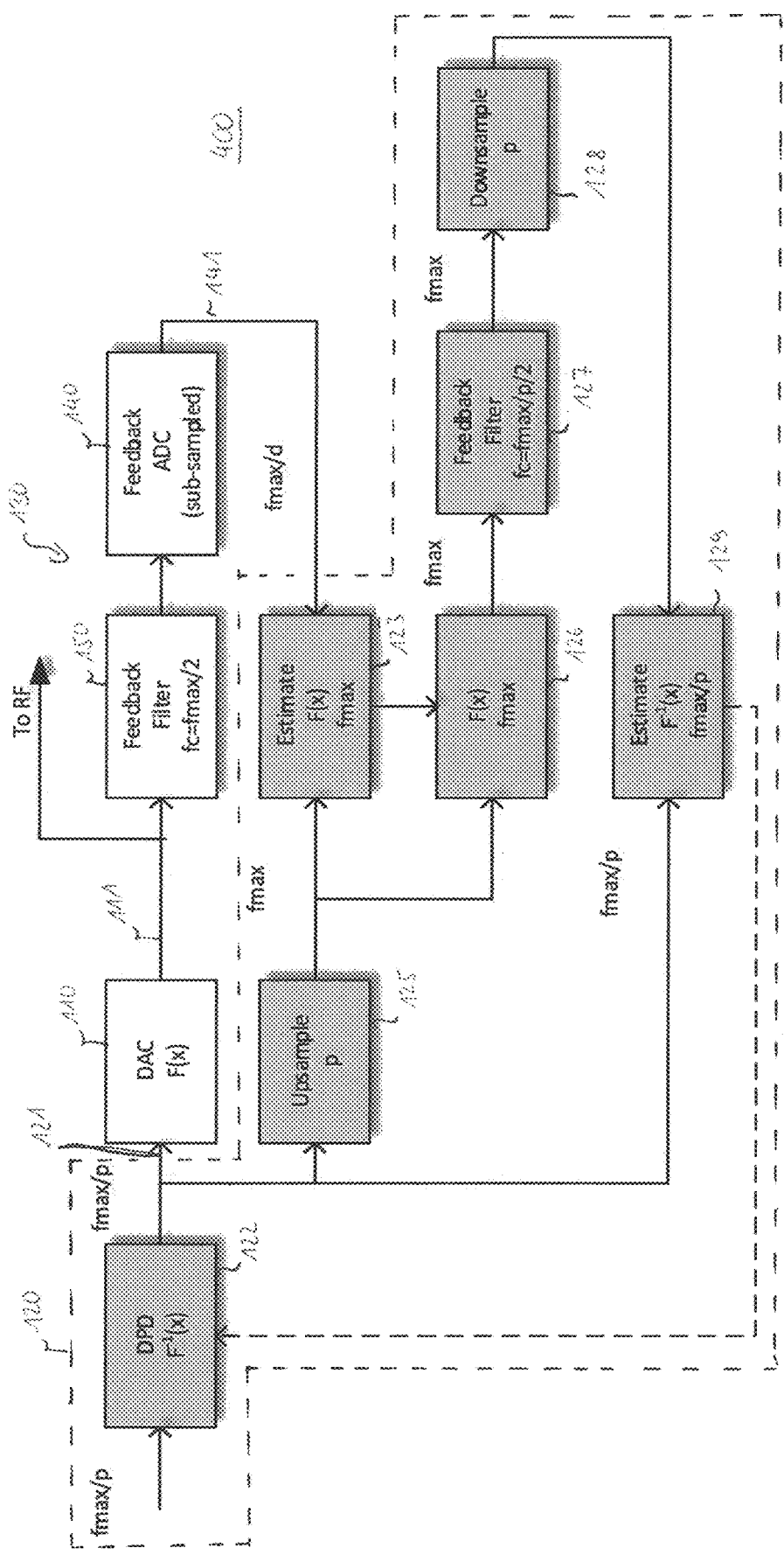
FIG. 4 illustrates a third example of a digital-to-analog conversion system.

In the example of FIG. 4, the instantaneous (current) sample rates of the pre-distorted digital signal 121 and the digital to analog converter 110 are lower than the maximum value of the sample rate of the digital to analog converter 110. The sample rates of the pre-distorted digital signal 121 and the digital to analog converter 110 are $f_{max}/p$, i.e. a p-th of the maximum value of the sample rate of the digital to analog converter 110.

The sample rate of the ADC 140 is again lower the instantaneous sample rate of the digital to analog converter 110, i.e. the sample rate of the ADC 140 is lower than $f_{max}/p$. The cutoff frequency of the filter 150 is again fixed to half of the maximum value of the sample rate of the digital to analog converter 110, i.e. to $f_{max}/2$. Further, the bandwidth of the filter 150 equal to of the maximum value of the sample rate of the digital to analog converter 110.

An advantage of the proposed architecture is that once the direct model of the ADC has been estimated at the maximum supported rate, the anti-alias filtering, down-sampling and inverse nonlinearity $F^{-1}(z(n))$ may be implemented in the digital domain. Therefore, a single feedback filter with a bandwidth equal to the maximum frequency of operation, $f_{max}/2$ may be used. This will be described in the following with more details.

The digital circuit 120 is configured to up-sample the pre-distorted digital signal from its instantaneous sample rate $f_{max}/p$ to the maximum value of the sample rate $f_{max}$ of the digital to analog converter 110 in order to generate an up-sampled pre-distorted digital signal (indicated in FIG. 4 by means of functional upsampling block 125). The up-sampled pre-distorted digital signal exhibits the sample rate $f_{max}$.

Further, the digital circuit 120 is configured to determine the mathematical model of the transfer function of the digital to analog converter 110 when operating at a maximum value of the sample rate based on the up-sampled pre-distorted digital signal and the digital feedback signal 141 (indicated in FIG. 4 by means of functional estimation block 123). In other words, the digital circuit 120 determines the mathematical model as described above for the digital to analog converter 110 operating a maximum sample rate by using the up-sampled pre-distorted digital signal instead of the pre-distorted digital signal at the lower sample rate $f_{max}/p$ The digital circuit is configured to subsequently determine, based on the mathematical model and the up-sampled pre-distorted digital signal, an auxiliary feedback signal (indicated in FIG. 4 by means of functional feedback block 126). The auxiliary feedback signal exhibits a sample rate equal to the maximum value of the sample rate of the digital-to-analog converter. The auxiliary feedback signal represents a simulated output of the ADC 140 if the ADC 140 was operated at the maximum value of the sample rate of the digital to analog converter 110. Due to the knowledge about the digital to analog converter behavior (described by the mathematical model) and the pre-distorted digital signal 121, the digital to analog converter output at the maximum value of the sample rate of the digital-to-analog converter may be estimated. Since the up-sampled pre-distorted digital signal and the auxiliary feedback signal are at the same higher sample rate, the inverse nonlinearity of the digital to analog converter 110 at lower sample rate may be directly estimated.

Therefore, the digital circuit 120 is further configured to filter the auxiliary feedback signal with a cutoff frequency equal to half of the sample rate of the pre-distorted digital signal, i.e. cutoff frequency equal to $f_{max}/2p$ (indicated in FIG. 4 by means of functional filter block 127).

Further, the digital circuit 120 is configured to down-sample the auxiliary feedback signal after filtering to obtain a down-sampled auxiliary feedback signal exhibiting the sample rate of the pre-distorted digital signal 121, i.e. exhibiting a sample rate of $f_{max}/p$ (indicated in FIG. 4 by means of functional downsampling block 128).

Finally, the digital circuit 120 is further configured to determine, based on the pre-distorted digital signal and the down-sampled auxiliary feedback signal, a set of pre-distortion coefficients for generating the pre-distorted digital signal 121 (indicated in FIG. 4 by means of functional estimation block 128). For example, the pre-distortion coefficients for generating the pre-distorted digital signal may be determined by solving the above mathematical expression (13).

The digital circuit 120 may use the set of pre-distortion coefficients for generating the pre-distorted digital signal 121 at the sample rate $f_{max}/p$.

It is evident from the above description that the feedback loop 130 may be operated independent from the sample rate of the pre-distorted digital signal 121 and/or the sample rate of the digital to analog converter 110. That is, the proposed feedback loop 130 may enable a high flexibility with respect to the used sample rates. In particular, the same filter 150 may be used for any sample rate of the pre-distorted digital signal 121 and/or the digital to analog converter 110 up to the maximum sample rate of the digital to analog converter 110.

Similar to what is described above, the digital-to-analog conversion system 150 may optionally further comprise a power amplifier and a second feedback loop as described above in connection with FIG. 3. Based on the pre-distorted digital signal 121 and the feedback signals of both feedback loops, a mathematical model of the transfer functions of the digital to analog converter 110 and the power amplifier at the maximum value of the sample rate of the digital to analog converter 110 may be determined similar to what is described above in connection with FIG. 4. A set of pre-distortion coefficients for generating the pre-distorted digital signal 121 may be determined based on the mathematical model of the transfer functions.

Figure 5:
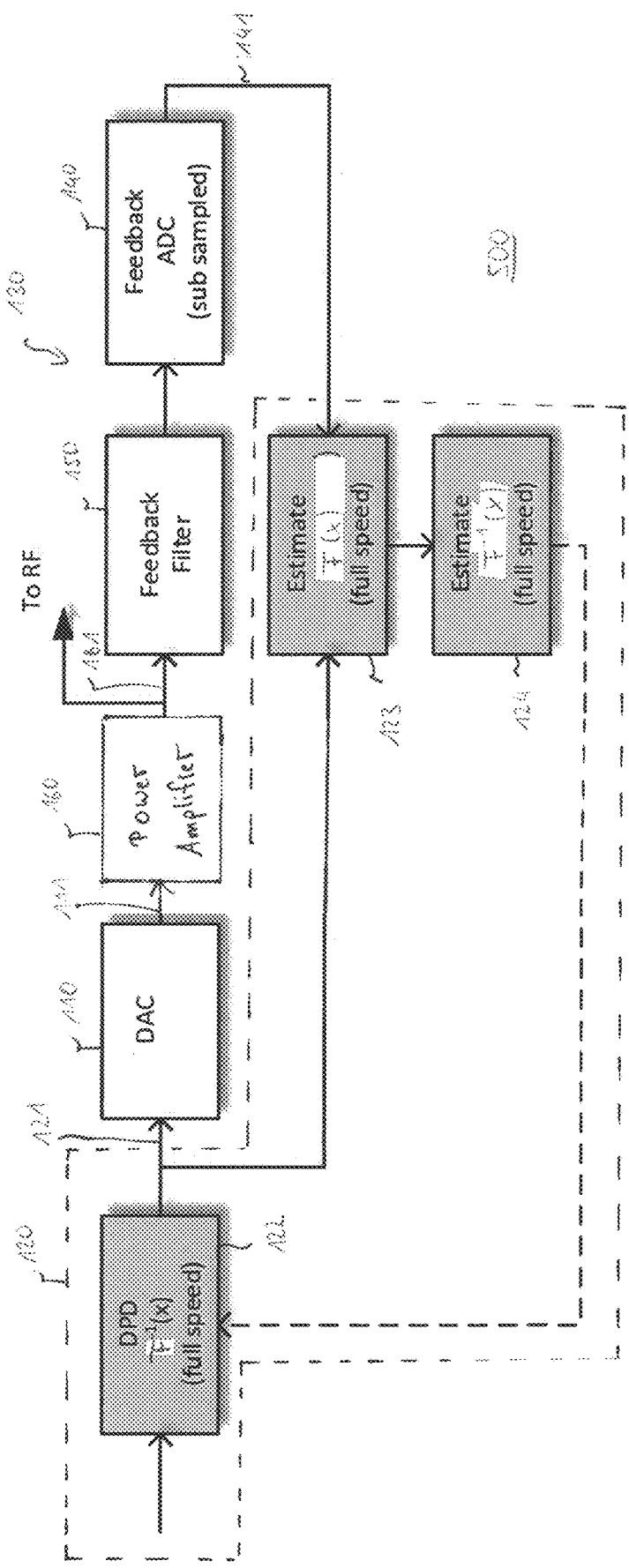
FIG. 5 illustrates a fourth example of a digital-to-analog conversion system.

Another example of a feedback loop for a combination of a digital to analog converter and a power amplifier is illustrated in FIG. 5. FIG. 5 illustrates digital-to-analog conversion system 500 comprising a digital to analog converter 110 and power amplifier 160. The digital to analog converter 110 is configured to receive a pre-distorted digital signal 121 from a digital circuit 120, and to generate an analog signal 111 based on the pre-distorted digital signal 121. The power amplifier 160 is coupled to the digital to analog converter 110 and configured to amplify the analog signal 111 for generating an amplified signal 161.

Also the digital-to-analog conversion system 500 comprises a feedback loop 130 for providing a digital feedback signal 141 to the digital circuit 120 such that the digital circuit 120 may train the DPD.

The feedback loop 130 comprises an ADC 140 configured to generate the digital feedback signal 141 based on the amplified signal 161. A sample rate of ADC 140 is lower than a sample rate of the digital to analog converter 110. In other words, the amplified signal 161 is sub sampled by the ADC 140.

The feedback loop 130 further comprises a filter 150 with a fix cutoff frequency. The filter 150 is coupled between the power amplifier 160 and the ADC 140. The feedback loop of the digital-to-analog conversion system 500 may be implemented substantially similar to the above described feedback loops of the digital-to-analog conversion system 100 to 400. Individual components of the feedback loop of the digital-to-analog conversion system 500 may be implemented/ configured as described above. For example, the cutoff frequency of the filter 150 may be independent from an instantaneous value of the sample rate of the digital to analog converter 110, or the ADC 140 may be configured to sample the amplified signal 161 at irregular time intervals such that the sample rate of the ADC 140 is (remains) on average constant.

Similar to what is described above individually for digital to analog converters and power amplifiers, the digital circuit 120 is configured to determine, based on the pre-distorted digital signal 121 and the digital feedback signal 141, a common mathematical model of transfer functions of the digital to analog converter 110 and the power amplifier 160 (indicated in FIG. 5 by means of functional estimation block 123).

The digital circuit 120 is further configured to determine, based on the mathematical model, a set of pre-distortion coefficients for generating the pre-distorted digital signal 121 in accordance with the above explanations (indicated in FIG. 5 by means of functional estimation block 124).

In the example of FIG. 5, it is again assumed that the sample rate of the pre-distorted digital signal 121 and the digital to analog converter 110 are at the maximum value of the sample rate of the digital to analog converter. However, it is to be noted that for lower sample rates, the processing in the digital domain as described above in connection with FIG. 4 may be used accordingly.

The digital-to-analog conversion system 500 may be understood as combined system of a digital to analog converter and a power amplifier with a low cost, low (die) area and low power feedback path circuitry that enables to train a DPD function for compensating (mitigating) the nonlinear behavior of the digital to analog converter and the power amplifier.

The examples described above in connection with FIGS. 1 to 5 may enable a wideband digital to analog converter DPD training using the (e.g. irregularly) sub-sampled ADC.

When the exemplary digital-to-analog conversion systems described above in connection with FIGS. 1 to 5 are initialized and no DPD coefficients are yet available, the DPD may be bypassed or give a trivial response (e.g. output is identical to input). If the DPD is bypassed, the above mentioned "pre-distorted digital signal" supplied to the digital to analog converter 110 is the bypassed signal provided by the digital circuit 120 to the digital to analog converter 110.

Figure 6:
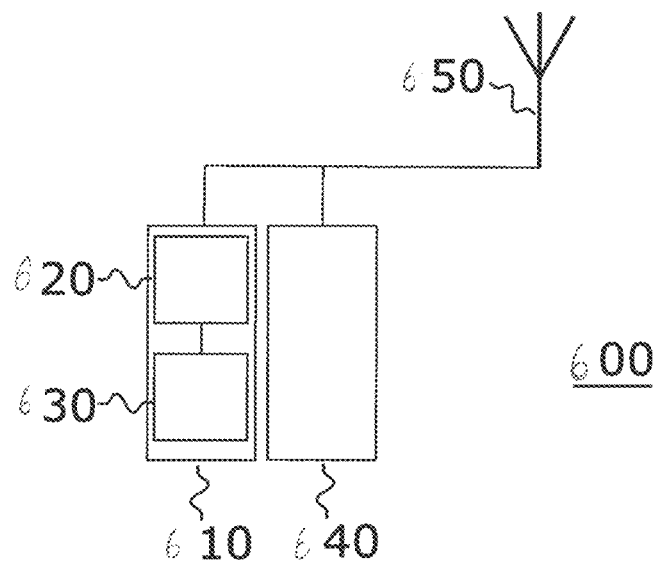
FIG. 6 illustrates an example of a base station.

An example of an implementation using a digital-to-analog conversion system according to one or more aspects of the architecture described above or one or more examples described above is illustrated in FIG. 6. FIG. 6 schematically illustrates an example of a radio base station 600 (e.g. for a femtocell, a picocell, a microcell or a macrocell) comprising a digital-to-analog conversion system 2020 as proposed.

The digital-to-analog conversion system 620 is part of a transmitter 610. The transmitter 610 additionally comprises a digital circuit 630 (e.g. a DSP) configured to supply the pre-distorted digital signal to the digital to analog converter of the digital-to-analog conversion system 620. For example, the digital circuit 630 may be configured to generate the pre-distorted digital signal based on data to be wirelessly transmitted.

Further, the base station 600 comprises at least one antenna element 650 coupled to the transmitter 610 for radiating one or more RF transmit signals that are based on the digital to analog converter output to the environment. For example, the digital to analog converter of the digital-to-analog conversion system 620 may be coupled to the antenna element 650 via one or more intermediate elements such as a filter, an up-converter (mixer) or a power amplifier.

Additionally, the base station 600 comprises a receiver 640 configured to receive a RF receive signal from the antenna element 650 or another antenna element (not illustrated) of the base station 600.

To this end, a base station enabling direct generation of an RF transmit signal by means of a digital to analog converter may be enabled. The proposed digital-to-analog conversion system 620 may allow for wideband digital to analog converter compensation with reduced complexity, (die) size, power consumption and cost.

The base station 600 may comprise further elements such as, e.g., a baseband processor, an application processor, memory, a network controller, a user interface, power management circuitry, a satellite navigation receiver, a network interface controller or power tee circuitry. In some aspects, the application processor may include one or more Central Processing Unit (CPU) cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 7:
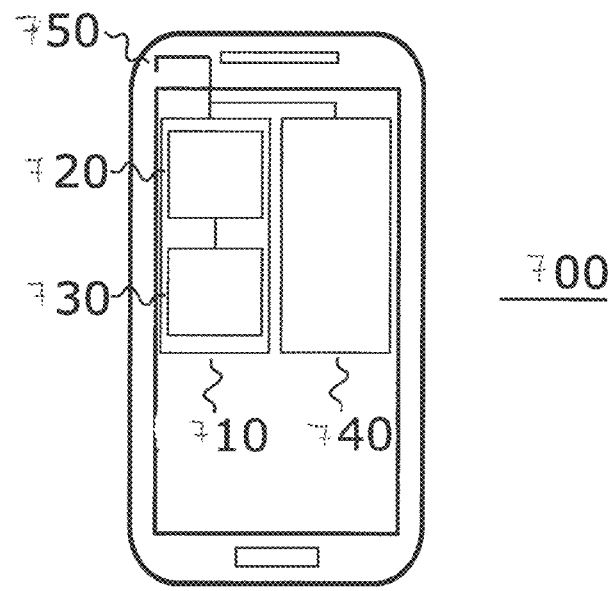
FIG. 7 illustrates an example of a mobile device.

Another example of an implementation using a digital-to-analog conversion system according to one or more aspects of the architecture described above or one or more examples described above is illustrated in FIG. 7. FIG. 7 schematically illustrates an example of a mobile device 700 (e.g. mobile phone, smartphone, tablet-computer, or laptop) comprising a digital-to-analog conversion system 720 as proposed.

The digital-to-analog conversion system 720 is part of a transmitter 710. The transmitter 710 additionally comprises a digital circuit 730 (e.g. a DSP) configured to supply the pre-distorted digital signal to the digital to analog converter of the digital-to-analog conversion system 720. For example, the digital circuit 730 may be configured to generate the pre-distorted digital signal based on data to be wirelessly transmitted.

Further, the mobile device 700 comprises at least one antenna element 750 coupled to the transmitter 710 for radiating one or more RF transmit signals that are based on the digital to analog converter output to the environment. For example, the digital to analog converter of the digital-to-analog conversion system 720 may be coupled to the antenna element 750 via one or more intermediate elements such as a filter, an up-converter (mixer) or a power amplifier.

Additionally, the mobile device 700 comprises a receiver 740 configured to receive a RF receive signal from the antenna element 750 or another antenna element (not illustrated) of the mobile device 700.

To this end, a mobile device enabling direct generation of an RF transmit signal by means of a digital to analog converter may be enabled. The proposed digital-to-analog conversion system 720 may allow for wideband digital to analog converter compensation with reduced complexity, (die) size, power consumption and cost.

The mobile device 700 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, $I^2C$ or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using digital-to-analog conversion according to the proposed architecture(s) or one or more of the examples described above may be configured to operate according to one of the 3GPP-standardized mobile communication networks or systems. The mobile or wireless communication system may correspond to, for example, a 5th Generation New Radio (5G NR), a Long-Term Evolution (LTE), an LTE-Advanced (LTEA), High Speed Packet Access (HSPA), a Universal Mobile Telecommunication System (UMTS) or a UMTS Terrestrial Radio Access Network (UTRAN), an evolved-UTRAN (eU-TRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Interoperability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

Example 1 is a digital-to-analog conversion system, comprising: a digital to analog converter configured to: receive a pre-distorted digital signal from a digital circuit; and generate an analog signal based on the pre-distorted digital signal; and a feedback loop for providing a digital feedback signal to the digital circuit, wherein the feedback loop comprises an ADC configured to generate the digital feedback signal based on the analog signal, and wherein a sample rate of the ADC is lower than a sample rate of the digital to analog converter. Further alternatives may also have a sample rate of an ADC that is equal to a sample rate of the digital to analog converter Example 2 is the digital-to-analog conversion system of claim 1, wherein the sample rate of the ADC is at least 10 times lower than the sample rate of the digital to analog converter.

Example 3 is the digital-to-analog conversion system of claim 1 or claim 2, wherein the sample rate of the ADC is at least 50 times lower than the sample rate of the digital to analog converter.

Example 4 is the digital-to-analog conversion system of any of claims 1 to 3, wherein the feedback loop further comprises a filter with a fix cutoff frequency, wherein the filter is coupled between the digital to analog converter and the ADC.

Example 5 is the digital-to-analog conversion system of claim 4, wherein the cutoff frequency is independent from an instantaneous value of the sample rate of the digital to analog converter.

Example 6 is the digital-to-analog conversion system of claim 4 or claim 5, wherein the cutoff frequency is equal to half of a maximum value of the sample rate of the digital to analog converter.

Example 7 is the digital-to-analog conversion system of any of claims 1 to 6, wherein an input bandwidth of the filter is equal to or higher than half of a maximum value of the sample rate of the digital to analog converter.

Example 8 is the digital-to-analog conversion system of any of claims 1 to 7, wherein an input bandwidth of the ADC is equal to or higher than half of a maximum value of the sample rate of the digital to analog converter.

Example 9 is the digital-to-analog conversion system of any of claims 1 to 8, wherein the ADC is configured to sample the analog signal at irregular time intervals, and wherein the sample rate of the ADC is constant on average.

Example 10 is the digital-to-analog conversion system of claim 9, wherein the ADC is configured to: receive a clock signal; count a number of clock cycles; sample the analog signal every time the number of clock cycles is equal to a stored value; and update the stored value after sampling the analog output signal.

Example 11 is the digital-to-analog conversion system of claim 9, further comprising a clock divider circuit configured to receive a first clock signal and to divide the first clock signal with varying division factors in order to generate a second clock signal with varying clock cycles for the ADC, wherein the ADC is configured to sample the analog signal based on the second clock signal.

Example 12 is the digital-to-analog conversion system of any of claims 1 to 8, wherein the ADC is configured to sample the analog output signal at regular time intervals.

Example 13 is the digital-to-analog conversion system of claim 12, wherein the ADC is configured to sample the analog output signal at regular time intervals if a control signal received by the ADC indicates that the analog output signal exhibits a predetermined signal condition.

Example 14 is the digital-to-analog conversion system of any of claims 1 to 13, wherein the digital circuit is configured to determine, based on the pre-distorted digital signal and the digital feedback signal, a mathematical model of a transfer function of the digital to analog converter when operating at a maximum value of the sample rate.

Example 15 is the digital-to-analog conversion system of claim 14, wherein the digital circuit is further configured to determine, based on the mathematical model of the transfer function of the digital to analog converter, a set of pre-distortion coefficients for generating the pre-distorted digital signal.

Example 16 is the digital-to-analog conversion system of claim 14, wherein, if the sample rates of the pre-distorted digital signal and the digital to analog converter are lower than the maximum value of the sample rate of the digital to analog converter, the digital circuit is configured to up-sample the pre-distorted digital signal to the maximum value of the sample rate of the digital to analog converter in order to generate an up-sampled pre-distorted digital signal, and wherein the digital circuit is configured to determine the mathematical model based on the up-sampled pre-distorted digital signal and the digital feedback signal.

Example 17 is the digital-to-analog conversion system of claim 16, wherein the digital circuit is further configured to determine, based on the mathematical model and the up-sampled pre-distorted digital signal, an auxiliary feedback signal exhibiting a sample rate equal to the maximum value of the sample rate of the digital to analog converter.

Example 18 is the digital-to-analog conversion system of claim 17, wherein the digital circuit is further configured to filter the auxiliary feedback signal with a cutoff frequency equal to half of the sample rate of the pre-distorted digital signal.

Example 19 is the digital-to-analog conversion system of claim 18, wherein the digital circuit is further configured to further down-sample the auxiliary feedback signal after filtering to obtain a down-sampled auxiliary feedback signal exhibiting the sample rate of the pre-distorted digital signal.

Example 20 is the digital-to-analog conversion system of claim 19, wherein the digital circuit is further configured to determine, based on the pre-distorted digital signal and the down-sampled auxiliary feedback signal, a set of pre-distortion coefficients for generating the pre-distorted digital signal.

Example 21 is the digital-to-analog conversion system of any of claims 1 to 20, further comprising: a power amplifier coupled to the digital to analog converter and configured to amplify the analog signal for generating an amplified signal; and a second feedback loop for providing a second digital feedback signal to the digital circuit, wherein the feedback loop comprises a second ADC configured to generate the second digital feedback signal based on the amplified signal, and wherein a sample rate of the second ADC is lower than a sample rate of the digital to analog converter.

Example 22 is the digital-to-analog conversion system of claim 21, wherein the second feedback loop further comprises a second filter with the fix cutoff frequency, wherein the second filter is coupled between the power amplifier and the second ADC.

Example 23 is the digital-to-analog conversion system of claim 21 or claim 22, wherein the digital circuit is configured to determine, based on the pre-distorted digital signal and the second digital feedback signal, a mathematical model of a transfer function of the power amplifier.

Example 24 is the digital-to-analog conversion system of claim 23, wherein the digital circuit is further configured to determine, based on the mathematical model of the transfer function of the power amplifier, a set of pre-distortion coefficients for generating the pre-distorted digital signal.

Example 25 is a digital-to-analog conversion system, comprising: a digital to analog converter configured to: receive a pre-distorted digital signal from a digital circuit; and generate an analog signal based on the pre-distorted digital signal; a power amplifier coupled to the digital to analog converter and configured to amplify the analog signal for generating an amplified signal; and a feedback loop for providing a digital feedback signal to the digital circuit, wherein the feedback loop comprises an ADC configured to generate the digital feedback signal based on the amplified signal, and wherein a sample rate of the ADC is lower than a sample rate of the digital to analog converter.

Example 26 is the digital-to-analog conversion system of claim 25, wherein the feedback loop further comprises a filter with a fix cutoff frequency, wherein the filter is coupled between the power amplifier and the ADC.

Example 27 is the digital-to-analog conversion system of claim 26, wherein the cutoff frequency is independent from an instantaneous value of the sample rate of the digital to analog converter.

Example 28 is the digital-to-analog conversion system of any of claims 25 to 27, wherein the ADC is configured to sample the amplified signal at irregular time intervals, and wherein the sample rate of the ADC is on average constant.

Example 29 is the digital-to-analog conversion system of any of claims 25 to 28, wherein the digital circuit is configured to determine, based on the pre-distorted digital signal and the digital feedback signal, a mathematical model of the transfer functions of the digital to analog converter and the power amplifier.

Example 30 is the digital-to-analog conversion system of claim 29, wherein the digital circuit is further configured to determine, based on the mathematical model of the transfer functions of the digital to analog converter, a set of pre-distortion coefficients for generating the pre-distorted digital signal.

Example 31 is a transmitter, comprising: a digital-to-analog conversion system according to any of claims 1 to 30; and a digital circuit configured to supply the pre-distorted digital signal to the digital to analog converter.

Example 32 is the transmitter of claim 31, wherein the digital circuit is configured to generate the pre-distorted digital signal based on data to be wirelessly transmitted.

Example 33 is a mobile device, comprising: a transmitter according to claim 31 or claim 32; and at least one antenna element coupled to the digital-to-analog conversion system.

Example 34 is the mobile device of claim 33, further comprising a receiver configured to receive a RF receive signal from the antenna element.

Example 35 is a base station, comprising: a transmitter according to claim 31 or claim 32; and at least one antenna element coupled to the digital-to-analog conversion system.

Example 36 is the base station of claim 35, further comprising a receiver configured to receive a RF receive signal from the antenna element.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include DSP hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons.

Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A digital-to-analog conversion system, comprising:
   a digital-to-analog converter configured to:
     receive a pre-distorted digital signal from a digital circuit; and
     generate an analog signal based on the pre-distorted digital signal; and
   a feedback loop for providing a digital feedback signal to the digital circuit, wherein the feedback loop comprises an analog-to-digital converter configured to generate the digital feedback signal based on the analog signal, and wherein a sample rate of the analog-to-digital converter is lower than a sample rate of the digital-to-analog converter,
   wherein the analog-to-digital converter is configured to sample the analog signal at irregular time intervals, and wherein the sample rate of the analog-to-digital converter is constant on average.

2. The digital-to-analog conversion system of claim 1, wherein the sample rate of the analog-to-digital converter is at least 10 times lower than the sample rate of the digital-to-analog converter.

3. The digital-to-analog conversion system of claim 1, wherein the sample rate of the analog-to-digital converter is at least 50 times lower than the sample rate of the digital-to-analog converter.

4. The digital-to-analog conversion system of claim 1, wherein the feedback loop further comprises a filter with a fix cutoff frequency, wherein the filter is coupled between the digital-to-analog converter and the analog-to-digital converter.

5. The digital-to-analog conversion system of claim 4, wherein the cutoff frequency is independent from an instantaneous value of the sample rate of the digital-to-analog converter.

6. The digital-to-analog conversion system of claim 4, wherein the cutoff frequency is equal to half of a maximum value of the sample rate of the digital-to-analog converter.

7. The digital-to-analog conversion system of claim 4, wherein an input bandwidth of the filter is equal to or higher than half of a maximum value of the sample rate of the digital-to-analog converter.

8. The digital-to-analog conversion system of claim 1, wherein an input bandwidth of the analog-to-digital converter is equal to or higher than half of a maximum value of the sample rate of the digital-to-analog converter.

9. The digital-to-analog conversion system of claim 1, wherein the analog-to-digital converter is configured to:
   receive a clock signal;
   count a number of clock cycles;
   sample the analog signal every time the number of clock cycles is equal to a stored value; and
   update the stored value after sampling the analog output signal.

10. The digital-to-analog conversion system of claim 1, further comprising a clock divider circuit configured to receive a first clock signal and to divide the first clock signal with varying division factors in order to generate a second clock signal with varying clock cycles for the analog-to-digital converter, wherein the analog-to-digital converter is configured to sample the analog signal based on the second clock signal.

11. The digital-to-analog conversion system of claim 1, further comprising:
   a power amplifier coupled to the digital-to-analog converter and configured to amplify the analog signal for generating an amplified signal; and
   a second feedback loop for providing a second digital feedback signal to the digital circuit, wherein the feedback loop comprises a second analog-to-digital converter configured to generate the second digital feedback signal based on the amplified signal, and wherein a sample rate of the second analog-to-digital converter is lower than a sample rate of the digitalto-analog converter.

12. The digital-to-analog conversion system of claim 11, wherein the second feedback loop further comprises a second filter with the fix cutoff frequency, wherein the second filter is coupled between the power amplifier and the second analog-to-digital converter.

13. The digital-to-analog conversion system of claim 11, wherein the digital circuit is configured to determine, based on the pre-distorted digital signal and the second digital feedback signal, a mathematical model of a transfer function of the power amplifier.

14. The digital-to-analog conversion system of claim 13, wherein the digital circuit is further configured to determine, based on the mathematical model of the transfer function of the power amplifier, a set of pre-distortion coefficients for generating the pre-distorted digital signal.

15. A digital-to-analog conversion system, comprising:
a digital-to-analog converter configured to:
receive a pre-distorted digital signal from a digital circuit; and
generate an analog signal based on the pre-distorted digital signal;
a power amplifier coupled to the digital-to-analog converter and configured to amplify the analog signal for generating an amplified signal; and
a feedback loop for providing a digital feedback signal to the digital circuit, wherein the feedback loop comprises an analog-to-digital converter configured to generate the digital feedback signal based on the amplified signal, and wherein a sample rate of the analog-to-digital converter is lower than a sample rate of the digital-to-analog converter,
wherein the analog-to-digital converter is configured to sample the amplified signal at irregular time intervals, and wherein the sample rate of the analog-to-digital converter is on average constant.

16. The digital-to-analog conversion system of claim 15, wherein the feedback loop further comprises a filter with a fix cutoff frequency, wherein the filter is coupled between the power amplifier and the analog-to-digital converter.

17. The digital-to-analog conversion system of claim 16, wherein the cutoff frequency is independent from an instantaneous value of the sample rate of the digital-to-analog converter.

18. A transmitter, comprising:
a digital-to-analog conversion system according to claim 1; and
a digital circuit configured to supply the pre-distorted digital signal to the digital-to-analog converter.

19. The transmitter of claim 18, wherein the digital circuit is configured to generate the pre-distorted digital signal based on data to be wirelessly transmitted.

20. A base station, comprising:
a transmitter according to claim 18; and
at least one antenna element coupled to the digital-to-analog conversion system.

21. The base station of claim 20, further comprising a receiver configured to receive a radio frequency receive signal from the antenna element.

* * * * *